(12) United States Patent
Wanlass

(10) Patent No.: US 6,300,557 B1
(45) Date of Patent: Oct. 9, 2001

(54) LOW-BANDGAP DOUBLE-HETEROSTRUCTURE INASP/GAINAS PHOTOVOLTAIC CONVERTERS

(75) Inventor: Mark W. Wanlass, Golden, CO (US)

(73) Assignee: Midwest Research Institute, Kansas City, MO (US)

(*) Notice: Subject to any disclaimer, the term of this patent is extended or adjusted under 35 U.S.C. 154(b) by 0 days.

(21) Appl. No.: 09/416,014

(22) Filed: Oct. 8, 1999

Related U.S. Application Data

(60) Provisional application No. 60/103,768, filed on Oct. 9, 1998.

(51) Int. Cl.[7] .................................................. H01L 31/00
(52) U.S. Cl. ......................... 136/255; 136/244; 136/249; 136/256; 136/252; 136/253; 136/262; 257/431; 257/443; 257/461; 257/463; 257/466; 257/184; 257/191; 257/185; 257/190
(58) Field of Search .................. 136/244, 255, 136/249 TJ, 256, 249 MS, 252, 262, 253; 257/431, 443, 461, 463, 466, 184, 191, 185, 190

(56) References Cited

U.S. PATENT DOCUMENTS

| | | |
|---|---|---|
| 4,017,332 * | 4/1977 | James ............................ 136/262 |
| 4,291,323 * | 9/1981 | Bachmann ...................... 136/262 |
| 4,633,030 | 12/1986 | Cook. |
| 4,846,896 | 7/1989 | Hokuyo. |
| 5,266,125 | 11/1993 | Rand et al.. |
| 5,322,572 * | 6/1994 | Wanlass ......................... 136/249 |
| 5,389,158 | 2/1995 | Fraas et al.. |
| 5,471,076 * | 11/1995 | Murakami et al. ............. 257/184 |
| 5,479,032 * | 12/1995 | Forrest et al. ................. 257/190 |
| 5,593,901 | 1/1997 | Oswald et al.. |
| 5,616,185 | 4/1997 | Kukulka. |
| 5,769,964 | 6/1998 | Charache et al.. |
| 5,800,630 * | 9/1998 | Vivela et al. ................... 136/249 |
| 5,851,310 * | 12/1998 | Freundlich et al. ............ 136/255 |
| 5,853,497 | 12/1998 | Lillington et al.. |
| 6,043,426 * | 3/2000 | DePoy et al. .................. 136/253 |
| 6,057,506 * | 5/2000 | Charache et al. .............. 136/253 |
| 6,162,987 * | 12/2000 | Murray et al. ................. 136/253 |

OTHER PUBLICATIONS

Electronics Letters, 24(7), pp. 379–380, Mar. 1988.*
Webb et al, Vibrational Spectroscopy, vol. 21, pp. 3–15, Dec. 1999.*

* cited by examiner

*Primary Examiner*—Alan Diamond
(74) *Attorney, Agent, or Firm*—Paul J. White

(57) ABSTRACT

A low-bandgap, double-heterostructure PV device is provided, including in optical alignment a first $InP_{1-y}As_y$ n-layer formed with an n-type dopant, an $Ga_xIn_{1-x}As$ absorber layer, the absorber layer having an n-region formed with an n-type dopant and an p-region formed with a p-type dopant to form a single pn-junction, and a second $InP_{1-y}As_y$ p-layer formed with a p-type dopant, wherein the first and second layers are used for passivation and minority carrier confinement of the absorber layers.

17 Claims, 9 Drawing Sheets

LOW-BANDGAP DOUBLE-HETEROSTRUCTURE INASP/GAINAS PHOTOVOLTAIC CONVERTERS

CROSS-REFERENCE TO RELATED APPLICATION

Pursuant to 35 U.S.C. 119(e), Applicant claims the benefit of the 35 U.S.C. 111(b) provisional application Ser. No. 06/103,768, filed Oct. 9, 1998.

CONTRACTUAL ORIGIN OF THE INVENTION

The United States Government has rights in this invention pursuant to Contract No. DE-AC36-99GO10337 between the United States Department of Energy and the Midwest Research Institute.

BACKGROUND OF THE INVENTION

1. Field of the Invention

This invention relates to the field of photovoltaic ("PV") direct energy conversion. In particular, the present invention relates to low-bandgap InAsP/GaInAs/InAsP double-heterostructure ("DH") converters.

2. Description of the Related Art

PV converters are used in a wide variety of applications. Low-bandgap thermophotovoltaic ("TPV") energy systems convert thermal energy to electric power using the same principle of operation as solar cells. In particular, a heat source radiatively emits photons that are incident on a semiconductor TPV cell. Photons with an energy greater than the bandgap ($E_g$) of the semiconductor cell excite electrons from the valence band to the conduction band (interband transition). The resultant electron hole pairs (ehp) are then collected by the cell junction. A photo-current/voltage is then available on external metal contacts that can power an electrical load. In the prior art, the object has been to continue in making improvements in the efficiency of these devices.

One way to maximize efficiency, power/density, or both of these in PV devices is to match the bandgap of the semiconductor to the radiator temperature. For a given radiator temperature, increasing the bandgap will generally increase device efficiency, while decreasing the bandgap will generally increase power density.

Currently, bandgap variation is achieved by growing ternary (three-component) and quaternary (four-component) epitaxial III-V semiconductor layers on binary (two-component) substrates. III-V semiconductors are formed from elements from groups III and V of the Periodic Table. Ternary semiconductors vary both the bandgap and lattice constant as the composition changes between the binary endpoints. For example, the room temperature InGaAs bandgap (Energy Gap) and lattice constant ($a_0$) can be varied between those for InAs and GaAs. Only a limited number of ternary semiconductors can be grown lattice matched to available binary substrates, and these particular ternary semiconductors have only discrete energy bandgaps. Examples of the designs include the solar cells based on the lattice-matched combinations $Ga_{0.52}In_{0.48}P/GaAs$, $As_xGa_{1-x}As/GaAs$, and $InP/Ga_{0.47}In_{0.53}As$. At 300° K $Ga_{0.47}In_{0.53}As$ is lattice-matched to InP and has a bandgap of 0.74 eV. A lattice-matched constraint, which is desired for the highest performance devices, severely limits the number of material options available for ternary epitaxial layers grown on binary substrates.

A low-bandgap, double-heterostructure ("DEH") converter design has also been used to produce high-efficiency PV converters using III-V semiconductors. Low-bandgap DH converters are based on the use of high-bandgap ternary layers applied to the front and back surfaces of a low-bandgap, ternary p/n-junction absorber, such as GaInAs. In the prior art, non-DH devices exhibit high minority-carrier surface recombination velocities, which are undesirable because recombination is known to lower the quantum efficiency and increase the reverse-saturation current density of the devices. Thus, high recombination velocities are constraints which have become problematic in the development of III-V PV converter devices. A need therefore exists for higher-efficiency III-V DH PV converters, of a substantially different design, wherein the high-bandgap ternary layers applied to the front and back surfaces of a low-bandgap ternary p/n-junction absorber component layers are used as passivation and confinement layers in order to efficiently suppress minority carrier recombination in the cells.

The voltage produced across the electrodes of a single TPV cell, however, is insufficient for certain solar applications. To achieve a useful power level from TPV devices, individual photovoltaic cells must be electrically connected in a series/parallel arrangement, which is referred to herein as a photovolatic "module." These modules can be created in a monolithic configuration on a single substrate and, as such, are referred to herein as monolithically interconnected modules ("MIM"). MIMs provide a number of advantages which are useful in the application of TPV systems, including a reduction in joule losses, flexibility in device design and electrical output characteristics, and simplified thermal management and long-wavelength photon recuperation. This later advantage is primarily due to the ease in application of metallic back-surface reflectors ("BSR") to the substrates.

Thin-film MIMs are typically manufactured by a deposition and patterning method. One example of a suitable technique for depositing a semiconductor material on a substrate is glow discharge in silane, as described, for example, in U.S. Pat, No. 4,064,521. Electrical isolation of the component photocells is typically accomplished with a groove, trench, or step formed through the semiconductor layers and terminating at the substrate. Several patterning techniques are conventionally known for forming the grooves separating adjacent photovoltaic cells, including silkscreening with resist masks, etching with positive of negative photoresists, mechanical scribing, electrical discharge scribing, and laser scribing. One objective forming the grooves is to make them as narrow and shallow as possible because deep grooves add to manufacturing costs and narrow grooves retain a larger percentage of the photocell cell surface area, which is actively engaged in producing electricity. Moreover, electrical isolation of the photovoltaic cells using grooves which terminate, through the semiconductor layers, at the substrate precludes the use of certain binary substrates, such as GaSb, which are difficult to render semi-insulating. Therefore, what is needed is a high-performance, low-band gap MIM which includes an integral cell isolation diode, which is useful for electrically isolating the photocell components.

SUMMARY OF THE INVENTION

It is therefore an object if the invention to improve the efficiency of III-V PV converters by providing a structure wherein the ternary layers applied to the front and back surfaces of the absorber a p/n-junction operate as passivation and confinement layers, which are useful to efficiently suppress minority carrier recombination.

It is a further object of the invention to provide low-bandgap (0.5–0.6 eV) III-V DH PV converters which are capable of lattice-mismatched growth on a binary crystal substrate.

It is yet another object of the invention to provide high-performance TPV discrete converters having a low-bandgap, which are grown lattice-mismatched on a binary substrate, such as InP, for use as component cells in monolithically interconnected modules having integral cell isolation diodes.

Additional advantages of the present invention will be set forth in part in the description that follows and in part will be obvious for that description or can be learned from practice of the invention. The advantages of the invention can be realized and obtained by the invention particularly pointed out in the appended claims.

To overcome the problems of the related art devices and in accordance with the purpose of the invention, as embodied and broadly described herein, a low-bandgap double-heterostructure PV device is provided, including in optical alignment a first $InP_{1-y}As_y$ n-layer formed with an n-type dopant, an $Ga_xIn_{1-x}As$ absorber layer, the absorber layer having an n-region formed with an n-type dopant and an p-region formed with a p-type dopant to form a single pn-junction, and a second $InP_{1-y}As_y$ p-layer formed with a p-type dopant, wherein the first and second layers are used for passivation and minority carrier confinement of the absorber layers.

DESCRIPTION OF THE DRAWINGS

The present invention is illustrated by way of example and not limitation in the accompanying figures in which like reference numerals indicate similar elements and in which.

DESCRIPTION OF THE PREFERRED EMBODIMENTS

Unless specifically defined otherwise, all technical or scientific terms used herein have the same meaning as commonly understood by one of ordinary skill in the art to which this invention belongs. Although any methods and materials similar or equivalent to those described herein can be used in the practice or testing of the present invention, the preferred methods and materials are now described.

The low-bandgap, high-efficiency InAsP/GaInAs/InAsP PV DH converters are based on the use of InAsP layers to effect passivation and minority-carrier confinement when applied to the front and back surfaces of a low-bandgap GaInAs p/n-junction absorber. This paring of the materials comprising the DH PV device provides improved performance because it reduces minority carrier recombination, resulting in a higher quantum efficiency and a lower reverse-saturation current density for the converter.

Figure 1:
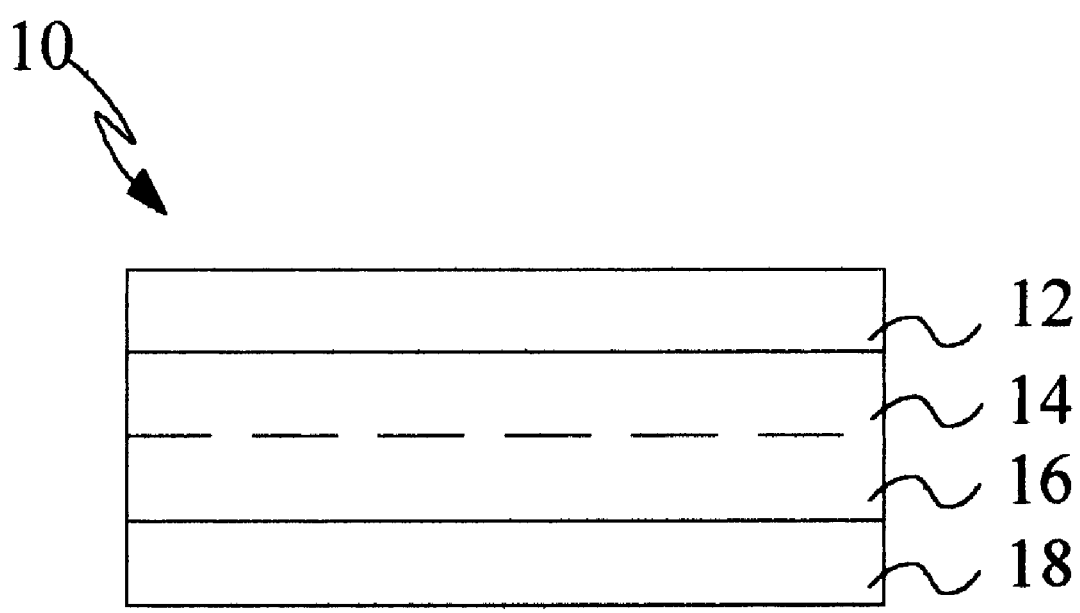
FIG. 1 is a schematic cross-section view of the DH PV converter in accordance with the present invention.

Referring now to the drawing figures, in which like numerals represent like elements, there is shown in FIG. 1 the general structure of the low-bandgap high efficiency InAsP/GaInAs/InAsP PV DH converter 10. The components of the DH converter 10 include in optical alignment a first $InP_{1-y}As_y$ n-layer 18 formed with an n-type dopant, an $Ga_xIn_{1-x}As$ absorber layer, the absorber layer having an n-region 16 formed with an n-type dopant and an p-region 14 formed with a p-type dopant to form a single pn-junction, and a second $InP_{1-y}As_y$ p-layer 12 formed with a p-type dopant, wherein the first 18 and second 12 layers are used for passivation and minority carrier confinement of the absorber layers 14, 16. A person of ordinary skill in the art will appreciate that the optical orientation and conductivity types of the layers can be changed so long as the regions remain compatible and the $InP_{1-y}As_y$ layers retain the passivation and confinement function in conjunction with the $Ga_xIn_{1-x}As$ absorber layer.

The converter 10 can be used as a discrete TPV device 20 having the below designed characteristics. To a good approximation, the bandgap ($E_g$) of $Ga_xIn_{1-x}As$ as a function of x at 300° K. is given by the following mathematical equation:

$$E_g(x) = (0.555x^2 + 0.505x + 0.356) \text{eV}$$

which yields x=0.35 for $E_g$=0.6 eV. It is believed, however, that this value of x is somewhat high. Empirically, it has been observed that the correct value of x to attain $E_g$=0.6 eV (2067 nm) is about 0.32. The lattice mismatch (M) between a $Ga_xIn_{1-x}As$ epilayer and an InP substrate is given by:

$$M(Ga_xIn_{1-x}As/InP) = (-0.378 + 0.810x / 11.927 - 0.405x)$$

Thus, M=−1.01% for x=0.32, where the minus sign indicates that the $Ga_xIn_{1-x}As$ epilayer experiences biaxial compression, a condition that maintains the integrity of the $Ga_xIn_{1-x}As$ (i.e., no mico-cracking within the epilayer). The lattice matching condition for epilayers of $InAs_yP_{1-y}$ and $Ga_xIn_{1-x}As$ is expressed by:

$$y = 1 - 2.143x$$

This equation yields y≈0.32 for x≈0.32. It has been determined that close lattice matching between the $Ga_xIn_{1-x}As$ and $InAs_yP_{1-y}$ epilayers is of paramount importance, particularly when $InAs_yP_{1-y}$ graded layers are used. Otherwise, micro-cracks in the epistructure have been observed, which occur as a result of the strain between the two ternaries. The bandgap of $InAs_yP_{1-y}$ at 300 ° K. is best expressed as:

$$E_g(y) = (0.320y^2 - 1.315y + 1.351) \text{eV}$$

Which gives $E_g$=0.96 eV for y=0.32.

Figure 2:
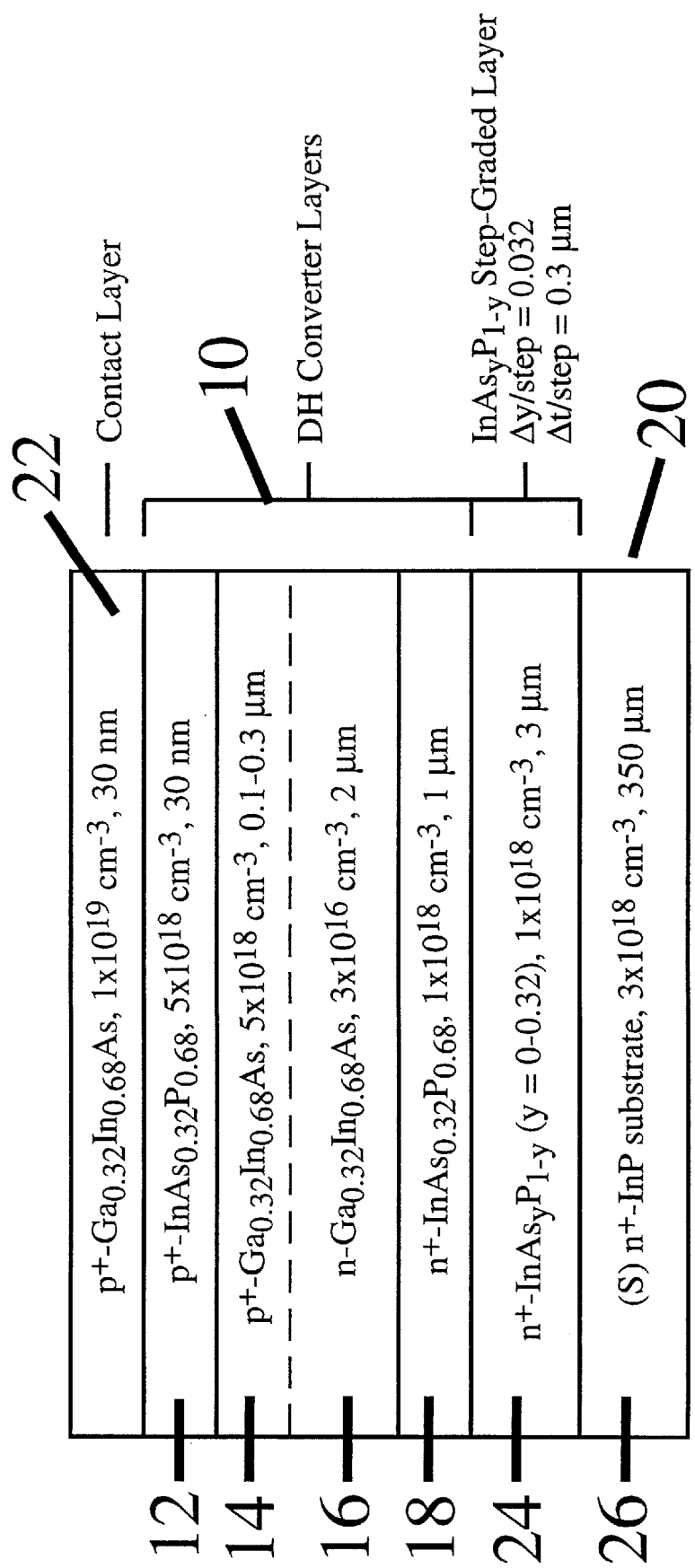
FIG. 2 is a schematic cross-section view of the structure of a discrete 0.6 eV TPV device using the DH PV converter shown in FIG. 1.

The epitaxial growth of a lattice-mismatched, 0.6-eV TPV and MIM device grown on a binary substrate can be achieved by any conventional means which is well known in the art. Referring once again to the drawing figures it is generally shown in FIG. 2 a cross-sectional diagram of the discrete 0.6-eV TPV converter epistructure. An atmospheric pressure metalorganic vapor phase epitaxy ("APMOVPE") growth process which employed a vertically oriented reactor vessel was used to yield highly uniform epilayers. This growth process has been described in U.S. Pat. No. 4,649,859 which is incorporated by reference. Epi-ready InP substrates 26, oriented (100) 2° toward (110), were loaded directly into the reactor vessel for growth. Discrete converters 10 were grown on polished etched S-doped InP substrates 26 and MIM structures 30, 40 were grown on double-sided-polished (DSP) Fe-doped InP substrates 38. Ethyldimethylindium, triethylgallium, arsine, and phosphine were used as the primary reactants, and diethylzinc and hydrogen sulfide were used to dope the epilayers p- and n-type, respectively. Epitaxial growth was performed in a purified hydrogen ambient at a temperature of 620° C. The deposition rates were 0.1 $\mu$m min$^{-1}$ for $InAs_{0.32}P_{0.68}$.

The procedures used to process the devices 10, 20, 30 and 40 are also conventional and are well known in the art. Selective wet-chemical etching was performed using $3H_3PO_4$:4 $H_2O$:1 $H_2O$ in order to dissolve $Ga_{0.32}In_{0.68}As$. Concentrated HCl was used to dissolve the $InAs_yP_{1-y}$. Electroplated Au was used to form the metallizations on the discrete TPV converters 10, 20. The general methods used to fabricate the MIMs can be by any method well known in the art, but the method used in this example has been described more fully in Ward, J. S. et al., A Novel Design for Monolithically Interconnected Modules (s) for Thermophotovoltaic (TPV) Power Conversion, Proc. 3$^{rd}$ NREL Conf. on Thermophotovoltaic Generation of Electricity, AIP Conf. Proc. Vol. 401, pp. 227–236, 1997. The insulator used in MIM fabrication is SiO2 ($\approx$200 nm) and was deposited by a chemical-vapor-deposition process. The metallization used for the MIMs was an electron-beam-evaporated multi-metal stack consisting essentially of: Cr (30 nm); Pd (20 nm); Ag (4 um, and Pd (20 nm)). The optimized back-surface reflector (BSR not shown), which was applied to the back surface of the MIM converters, consisted of a $MgF_2$ (130 nm), Ti (2.5 nm), and Au (150 nm) formulation.

EXAMPLE I

The present example relates to the epitaxial growth of the 0.6-eV TPV discrete converters and MIMs. Discrete converters 20 were fabricated using the basic DH TPV converter 10 epistructure shown in FIG. 1. In FIG. 2, the epistructure of a preferred 0.6-eV discrete converter 20 grown lattice-mismatched on an InP substrate 26 is shown. In point of reference, the episturcture is described in optical alignment from the substrate 26 upwards. The basic components of the structure 20 include an $InAs_yP_{1-y}$ step-graded layer 24, the 0.6-eV DH TPV converter layers 10, and a contact layer 22 used to facilitate contacting the front surface. Details of the composition, doping level, and thickness for each of the component layers of the 0.6-eV DH TPV converter structure 20 are listed in Table 1.

Referring again to FIG. 2, the $InAs_yP_{1-y}$ graded layer 24 comprises ten equal compositional steps. The steps are graded in magnitude resulting in a lattice-mismatch of $-0.1\%$ for each step interface (not shown). The grading increases from an initial compatible value on the side of the graded layer proximal to the substrate 26 surface to a final compatible value on the side of the step-graded layer which is proximal to the first $n^+$-$InP_{1-y}As_y$ layer 18. The graded layer 24 is terminated with the first $n^+$-$InP_{1-y}As_y$ layer 18, which is 1 um in thickness. This thicker layer 18 allows the final network of misfit dislocations arising from the final compositional step to evolve fully, leaving only a relatively low density of threading dislocations to propagate into the active converter layers above. This grading technique results in converter layers 10 having excellent electronic characteristics. For the reasons described below, the total thickness (2.1–2.3 um) of the $Ga_{0.32}In_{0.68}As$ p/n junction layers 16 and 14, of the DH converter 10 is about half the thickness normally required to provide complete absorption of the above-bandgap energy photons. The converter structure is designed for use as a MIM device 30 and 40 where a BSR is available to reflect unabsorbed near-bandgap-energy photons back thorough the converter layers 10, for a second pass. In addition, thinner p/n-junction layers 16 and 14, result in lower reverse-saturation current densities, which, in turn, result in higher converter 10 voltages ($\approx$18 mV higher for half the thickness, at 300° K.) Finally, thinner layers 16 and 14 require less growth time, which is a potential manufacturing advantage. A thickness in the range of 0.1–0.3 um has been used for the p+-$Ga_{0.32}In_{0.68}As$ emitter layer 14 of the DH converter 10.

The microstructure of the 0.6-eV DH TPV converter 20 was characterized using atomic-force microscopy (AFM), cross-sectional transmission electron microscopy (XTEM), and electron-beam-induced current (EBIC) techniques. To the naked eye, the surface of the converter 20 appears to have a fine, orthogonal, biaxial crosshatched morphology, which is typical of single-crystal lattice-mismatched III-V epilayers grown on substrates with a near –(100) orientation. Detailed examinations of the surface topography by AFM illustrated that a three-dimensional ripple morphology was superimposed on the crosshatch. The root mean-square roughness of the surface was $\approx$23 nm. STEM examinations illustrated that the structures had extensive misfit dislocation networks in the vicinity of the compositional steps in the graded region 24. At the top of the grade 24, proximal to layer 18, threading dislocations were observed to propagate into the DH converter 10 layers above. Plan-view EBIC was performed on discrete devices 10 and 20 to assess the degree of minority-carrier recombination at dislocations within the converter layers. The EBIC studies showed that carrier recombination was not occurring to any measurable degree; the threading dislocations could not be resolved as dark lines or spots. The above results indicate that the grading step 24 used for the 0.6 eV DH TPV epistructure produces converter layers having superior properties; the usual deleterious effects of threading dislocations being nonexistent.

Figure 3:
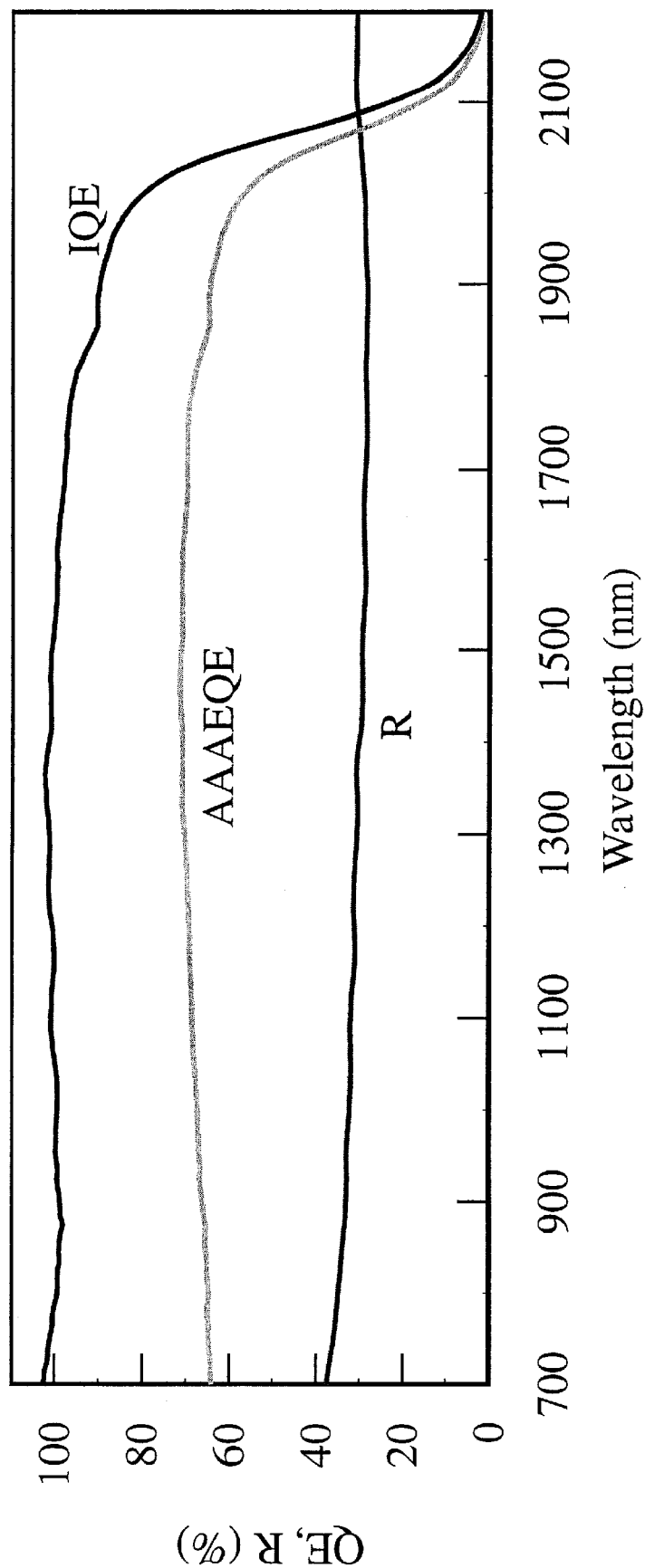
FIG. 3 is a graph of showing the spectral quantum efficiency and reflectance for the discrete 0.6 eV TPV converter shown in FIG. 2.

Referring now to FIG. 3, the spectral quantum efficiency (QE) and reflectance (R), data for the discrete 0.6-eV DH converter 20 without an antireflection coating ("ARC") are shown. The figure illustrates reflectance (R), active-area absolute external quantum efficiency (AAAEQE), and internal quantum efficiency (IQE) data for a representative high-performance 0.6 eV converter 20. The IQE data show that the carrier collection efficiency over the bulk of the response range is excellent ($\approx$90–100%), a result of excellent bulk material quality and low interfacial recombination at the outer edges of the p/n-junction absorber layers 14 and 16. Again, these results corroborate the above mentioned observations made with EBIC. However, near the band edge of the converter 20, the IQE rolls off, which is a result of the thin absorber layers 14 and 16 as set forth above. The near-band-edge QE improves markedly when the DH converter epistructure 10 is used in a MIM 30, 40 configuration with a BSR.

Figure 4:
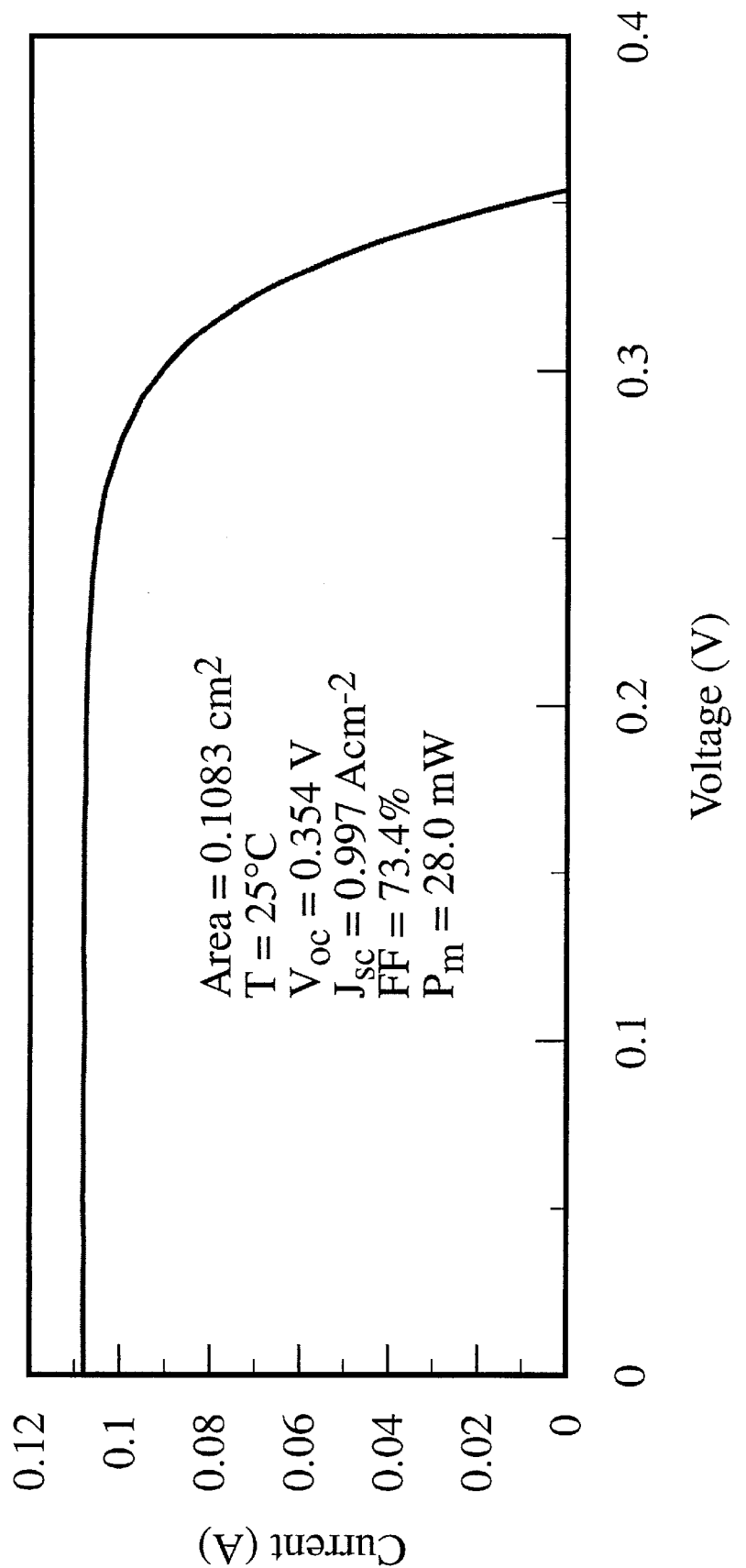
FIG. 4 is a graph showing the current-voltage for the discrete 0.6 eV TPV converter shown in FIG. 2.

Turning now to FIG. 4, the current-voltage data are shown for a representative discrete 0.6-eV converter 20 under high-intensity illumination. The typical photovoltaic performance parameters: open-circuit voltage ($V_{oc}$); short-circuit current density ($J_{sc}$); and fill factor (FF) are listed. For a bandgap of 0.6 eV, the values of FF (73.4%) and the voltage factor (defined as $V_{oc}/E_g$, 0.59) were excellent. Typical ranges for the diode ideality factors, and reverse-saturation current densities, for these converters 20 (derived from $V_{oc}(J_{sc})$ analyses) were 0.95–1.05, and 5–10×10−7 Acm$^{-2}$, respectively, at 25° C. These data illustrate the high-performance nature of the TPV converters 20 designed in accordance with the present invention.

Figure 5:
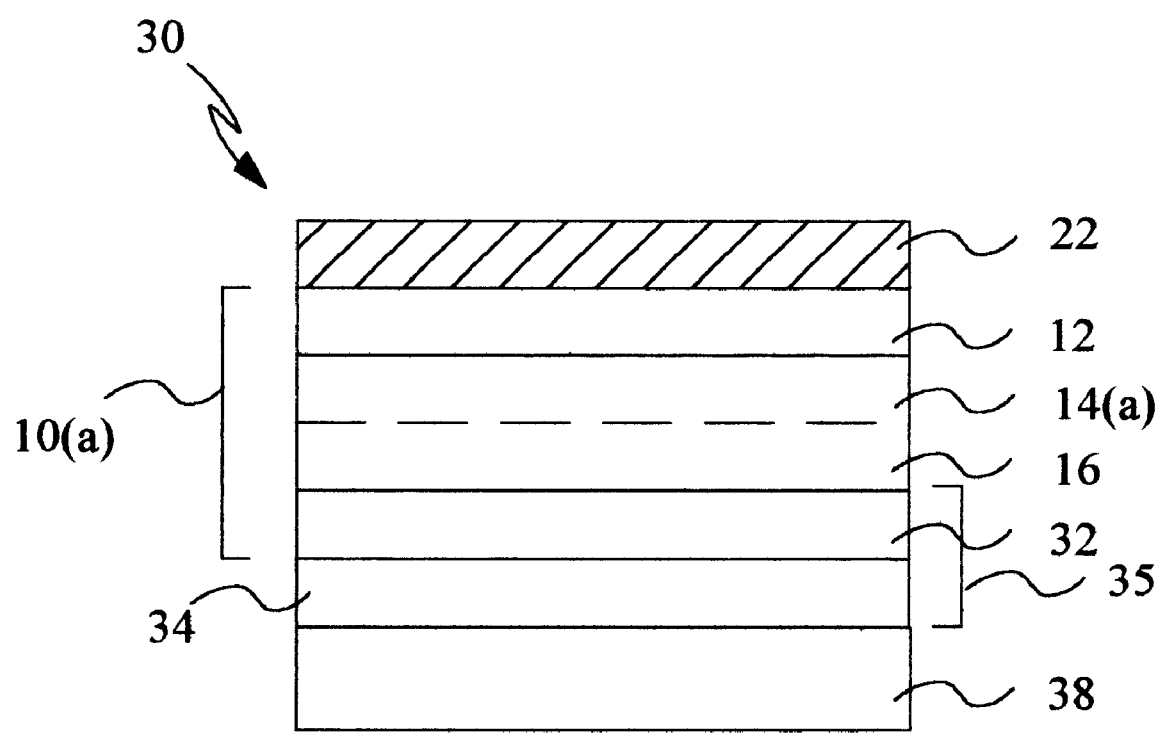
FIG. 5 is a schematic perspective view of a 0.6 eV TPV MIM structure using a variation in the DH PV converter epistructure set forth in FIG. 1.
Figure 6:
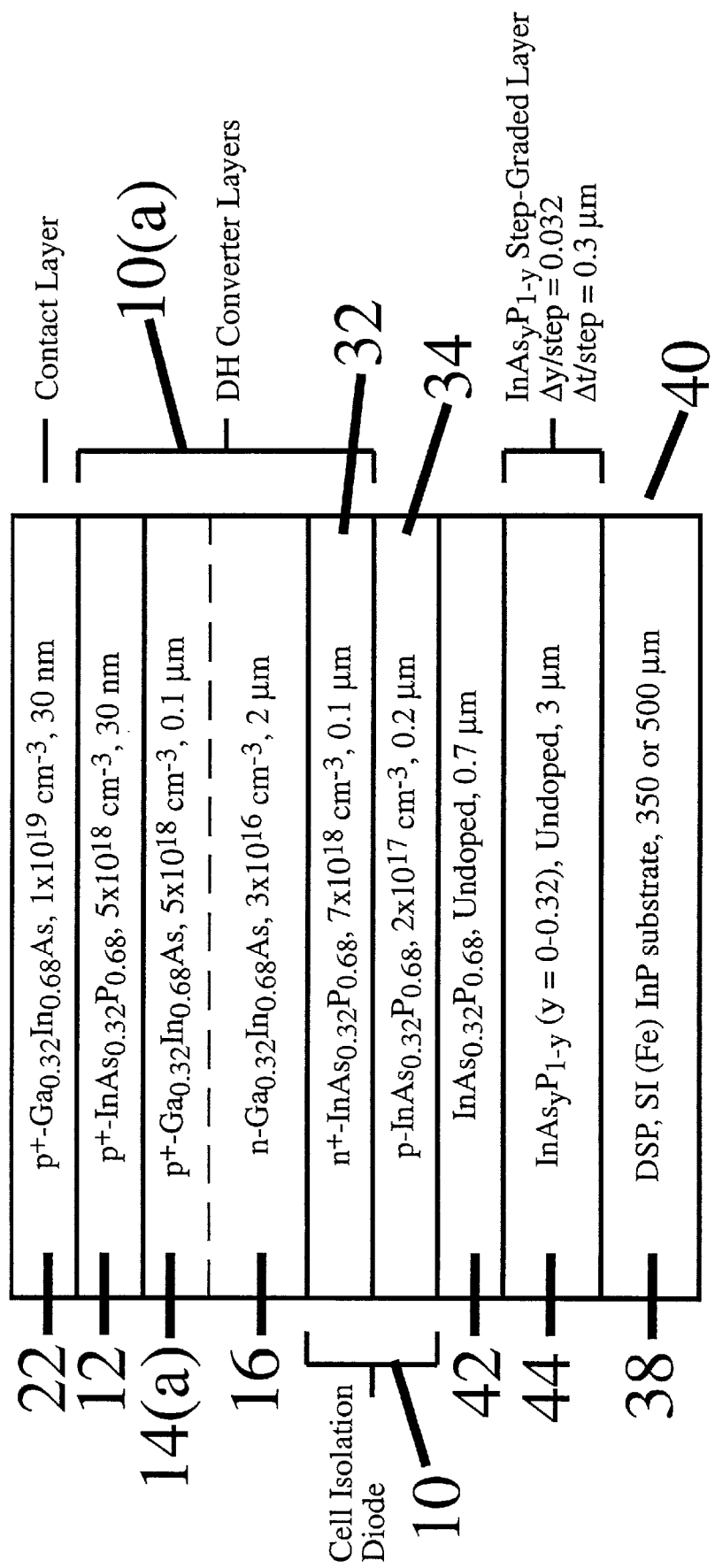
FIG. 6 is a preferred embodiment of the 0.6 eV TPV MIM of FIG. 5 showing incorporation of a step graded layer for growth on a binary substrate.

The basic design of the epistructure for the MIM is shown in FIG. 5. As shown in FIG. 6, the converter epistructure 10(a) for the MIM 40 fabrication is nearly identical to the epistructure 10 the 0.6-eV DH TPV discrete converters 30, 40, with the following exceptions: (1) the InP substrate 38 is double-sided-polished ("DSP") and semi-insulating ("SI") (Fe-doped and transparent to sub-bandgap-energy photons); (2) the InAs$_y$P$_{1-y}$ compositionally graded layer 44 is undoped making it transparent to sub-bandgap-energy photons; (3) a 0.3-um-thick n+/p InAs$_{0.32}$P$_{0.68}$ cell isolation diode (CID) 35 is included as an element of the 1-um thick n$^+$/p InAs$_{0.32}$P$_{0.68}$ layer 42, 34, 32 above the graded layer 44; and (4) the thickness of the p+-Ga$_{0/32}$In$_{0.68}$As emitter layer 14(a) is fixed at 0.1 um to reduce free-carrier absorption of sub-bandgap-energy, free-carrier absorption of the sub-bandgap-energy photons. At this thickness, the p+-Ga$_{0.32}$In$_{0.68}$As emitter layer 14(a) has a sheet resistance of ≈1600 ohms per square. The CID 35 serves two important functions. Electrical isolation of the component cells in the MIM is achieved by etching a trench (not shown) through the CID 35 n$^+$/p junction, the reverse-bias characteristic of the CID 35 preventing inter-cell shunting, and the depth of the isolation trench (not shown) is minimized because the CID 35 is disposed directly beneath the DH converter layers 10(a). This feature improves the characteristics of the cell interconnections of the MIM 40. The n$^+$-InAs$_{0.32}$P$_{0.68}$ layer 32 of the CID 35 is designed to serve the following important functions: (1) it is the back-surface confinement layer for the DH converter 10(a); (2) it works as a stop-etch layer for device processing, which ensures correct placement of the back contact 22 within the MIM structure 40; (3) it is also the back-contact, lateral-conduction layer for the MIM 40, the sheet resistance of the layer having 50 ohms per square, which results in negligible Joule losses; and (4) it is the emitter layer 32 for the CID 35. In an effort to reduce free-carrier absorption of sub-bandgap photons in the MIM structure 40, the p-InAs$_{0.32}$P$_{0.68}$ layer 34 of the CID 35 is grown just thick enough to support the space-charge region. Overall, the CID element is extremely useful in implementing MIM technology in these lattice-mismatched converter structures 30 and 40. The details of the composition, doping level, and thickness for each of the component layers for the MIM 30, 40 are also listed in Table 1.

Figure 7:
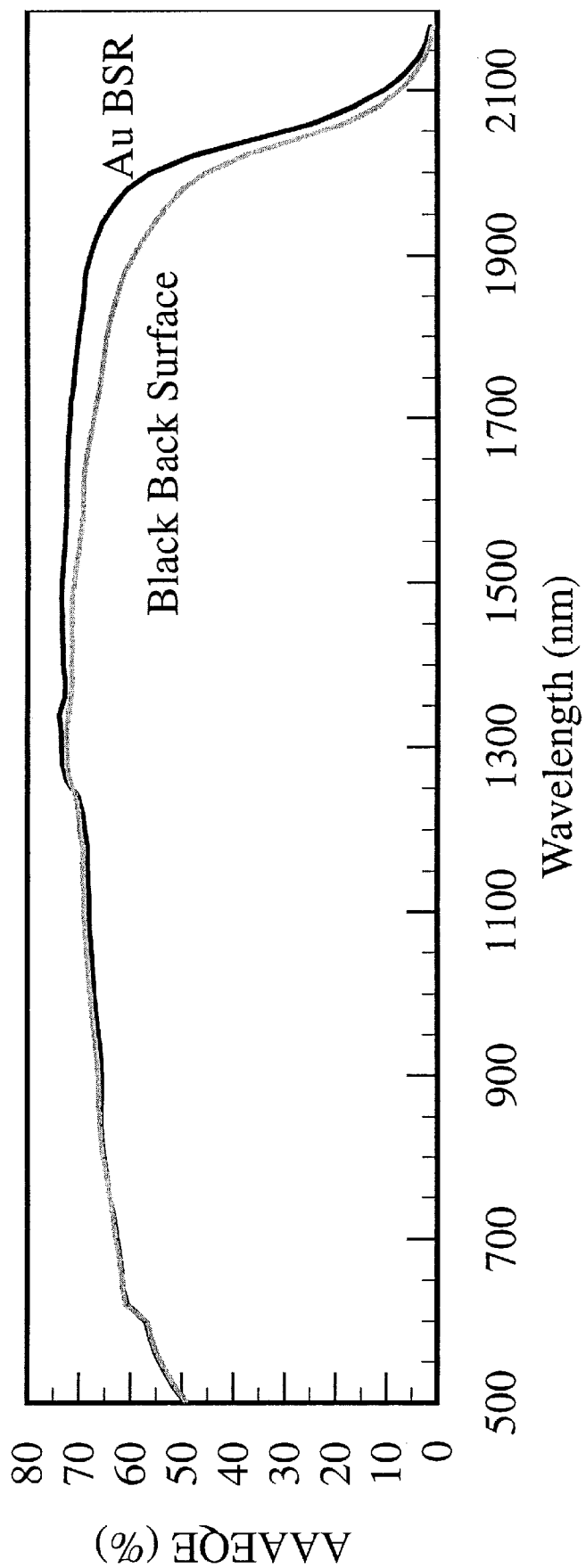
FIG. 7 is a graph showing the spectral AAAEQE data for a 0.6 eV MIM with, and without a back surface reflector ("BSR").

Spectral active-area absolute external quantum efficiency (AAAEQE) data (no ARC) are shown in FIG. 7 for the MIM 40 structure with and without a BSR (not shown). The improvement in the near-bandgap response was significant. These data demonstrate that the BSR serves the intended purpose of improving the long-wavelength QE of optically thin DH converters 10, 10(a).

Figure 8:
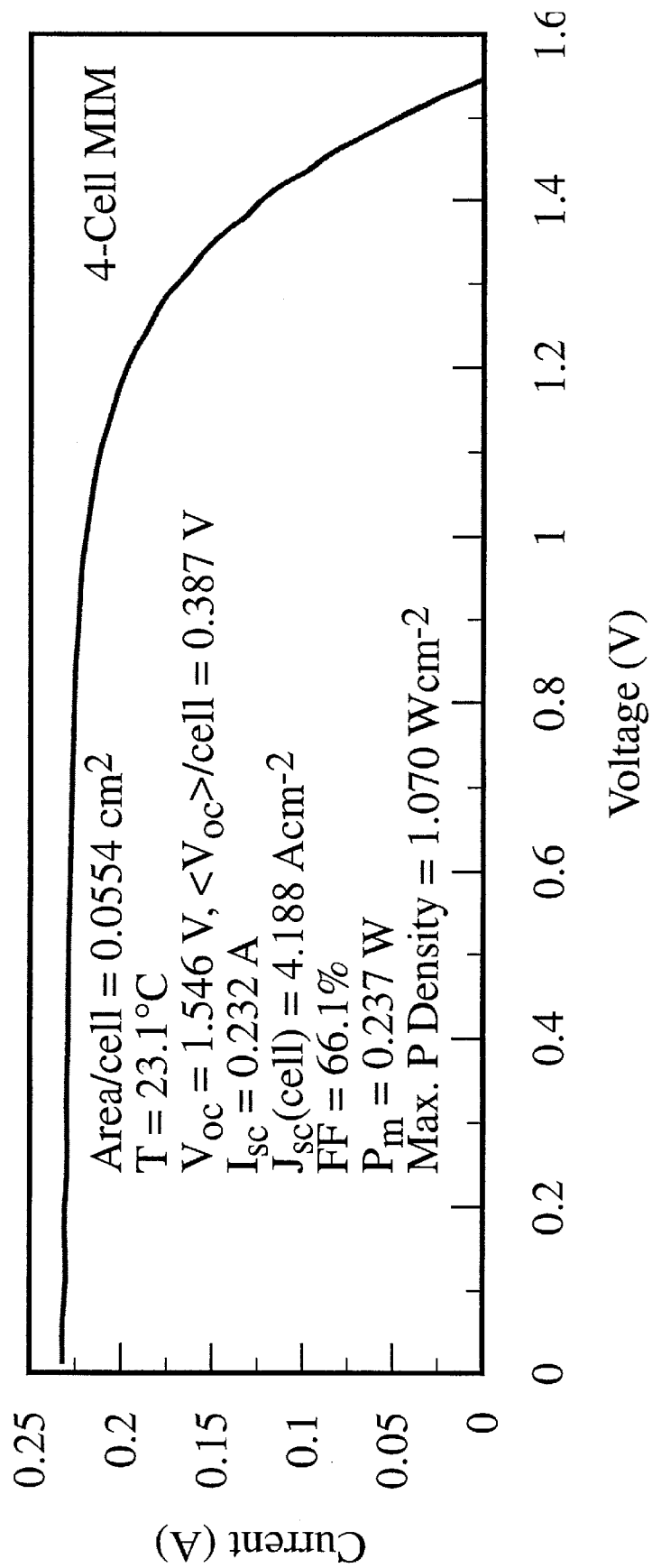
FIG. 8 is a graph showing the current-voltage data for a 0.6 eV MIM under high-intensity illumination.

Current-voltage data for a representative 0.6-eV, four-cell MIM 40 operated under high-intensity illumination are given in FIG. 8. The value of $V_{oc}$ for the MIM 40 (1.546 V) gives an average $V_{oc}$/cell of 0.387 V, which yields a voltage factor of 0.64. These data also show that the CID 35 provides excellent electrical isolation between the component cells in the MIM 40. The FF value (66.1%) can probably be improved somewhat through an optimization of the epistructure/metallization design. Assuming that the IQE data shown in FIG. 3 are a good approximation to the AAAEQE of this MIM 40 with an optimized ARC applied, then the data shown in FIG. 8 corresponds to operation of the MIM 40 under an ideal blackbody radiator at a temperature of 1027° C. Under these conditions, the maximum power density generated by the MIM 40 is 1.07 Wcm$^{-2}$, which is an improved level of performance.

Figure 9:
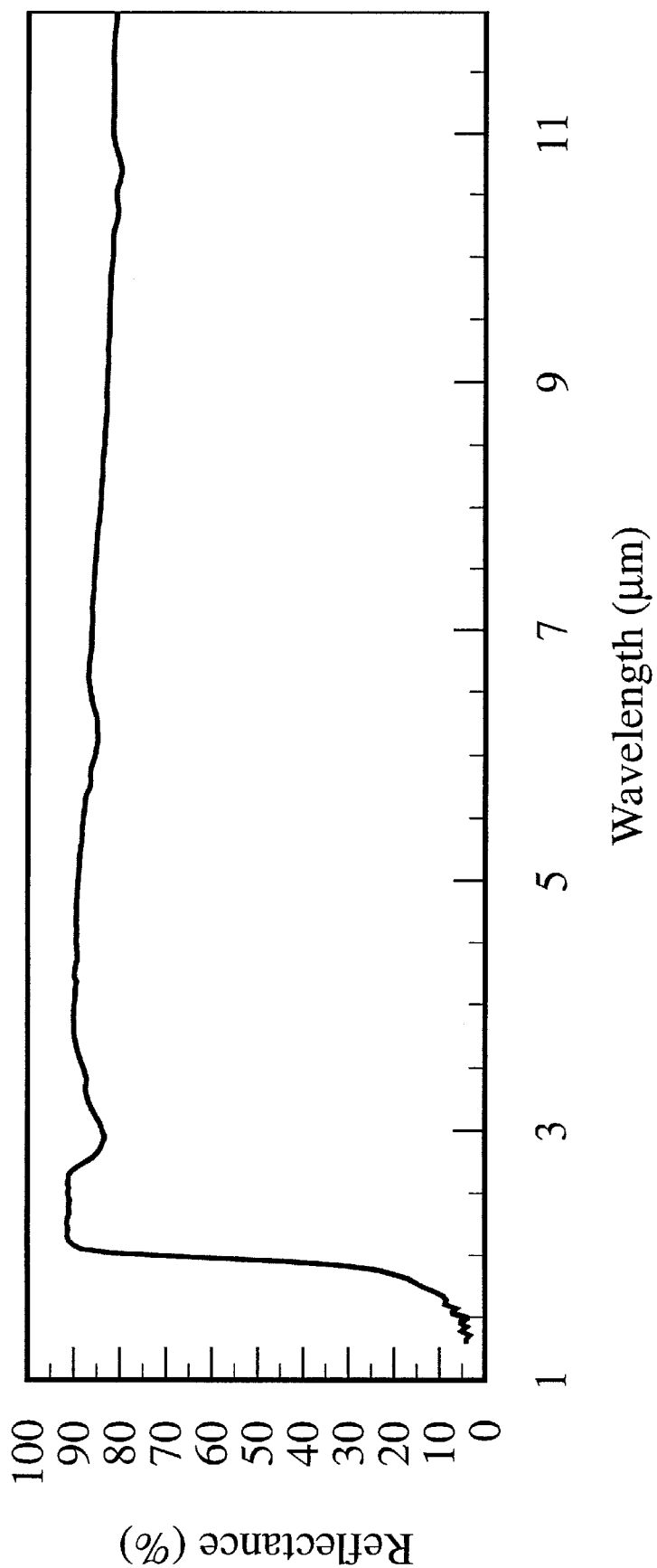
FIG. 9 is a graph showing the long-wavelength spectral reflectance data for a 0.6 eV MIM with a BSR.

High-reflectance BSRs are necessary for efficient recuperation of sub-bandgap energy photons in order to achieve high TPV system conversion efficiencies. Additionally, sub-bandgap energy free-carrier absorption within the MIM structure 40 must be as low as possible to maintain efficient recuperation. Long-wavelength spectral reflectance data for an as-grown, 0.6-eV MIM structure 40 (no metallization) with an optimized BSR are shown in FIG. 9. The data show that high reflectance's (80%–90%) are achieved for wavelengths ranging from 2 to 12 um, which indicates that the BSR has a high reflectance and that the free-carrier absorption of sub-bandgap energy photons is low.

While the present invention has been illustrated and described with reference to particular structures and methods of fabrication, it will be apparent that other changes and modifications can be made therein with the scope of the present invention as defined by the appended claims.

TABLE 1

Preferred Material, Thickness and Dopant Densities for the Various Semiconductor Layers

| Layer | Material/Function | Thickness | Dopant density (cm-3) |
|---|---|---|---|
| 12 | p$^+$-In$_{0.32}$As$_{0.68}$P passivation/confinement/window | 30 nm | 5 × 10$^{18}$ |
| 14 | p$^+$-Ga$_{0.32}$In$_{0.68}$As emitter | 0.1–0.3 um | 5 × 10$^{18}$ |
| 14(a) | p$^+$-Ga$_{0.32}$In$_{0.68}$As emitter | 0.1 um | 5 × 10$^{18}$ |
| 16 | n$^-$-Ga$_{0.32}$In$_{0.68}$As base | 2.0 um | 3 × 10$^{16}$ |
| 18 | n$^+$-InAs$_{0.32}$P$_{0.68}$ passivation/confinement/contact | 1.0 um | 1 × 10$^{18}$ |
| 22 | p$^+$-Ga$_{0.32}$In$_{0.68}$As contact | 30 nm | 1 × 10$^{19}$ |
| 24 | n$^+$-InAs$_y$P$_{1-y}$ lattice step graded (y = 0.0–0.32) | 3.0 um | 1 × 10$^{18}$ |
| 26 | S n$^+$-InP substrate | 350 um | 1 × 10$^{18}$ |
| 32 | n$^+$-InAs$_{0.32}$P$_{0.68}$ passivation/confinement/contact | 0.1 um | 7 × 10$^{18}$ |
| 34 | p-InAs$_{0.32}$P$_{0.68}$ pn-junction isolation/CID | 0.2 um | 2 × 10$^{17}$ |
| 38 | (Fe) DSP InP substrate semi-insulating/CID | 350 or 500 um | undoped |
| 42 | InAs$_{0.32}$P$_{0.68}$ buffer | 0.7 um | undoped |
| 44 | InAs$_y$P$_{1-y}$ lattice step graded (y = 0.0–0.32) | 3.0 um | undoped |

I claim:

1. A low-bandgap, double-heterostructure PV device, including in optical alignment a first InP$_{1-y}$As$_y$ n-layer formed with an n-type dopant, an Ga$_x$In$_{1-x}$As absorber layer, the absorber layer having an n-region formed with an n-type dopant, and an p-region formed with a p-type dopant adjacent the n-region to form a single p/n-junction, and a second InP$_{1-y}$As$_y$ p-layer formed with a p-type dopant, wherein the first and second layers are used for passivation and minority carrier confinement of the absorber layer, the values for y and x in the range of 0<y<1 and 0<x<1.

2. The PV device of claim 1 wherein the Ga$_x$In$_{1-x}$As absorber layer has a bandgap ($E_g$) of 0.6-eV and the InP$_{1-y}$As$_y$ layers have a bandgap ($E_g$) of 0.96-eV.

3. The PV device of claim 1 wherein the p-dopant concentrations are equal to or greater than $5\times10^{18}$ atoms/cm$^3$, the InP$_{1-y}$As$_y$ n-dopant concentration is equal to or greater than $1\times10^{18}$ atoms/cm$^3$, and the Ga$_x$In$_{1-x}$As n-dopant concentration is equal to or greater than $3\times10^{16}$ atoms/cm$^3$.

4. The PV device of claim 1 further comprising an InP n-type substrate formed with an n-type dopant, and a step-graded InP$_{1-y}$As$_y$ n-layer formed with an n-type dopant wherein the y and x values are in the range of 0<y<1 and 0<x<1 and, the step-graded-layer intervening in optical alignment with the InP substrate and the first InP$_{1-y}$As$_y$ n-layer, the step-graded layer having a lattice constant which is graded in magnitude from an initial compatible value on the side of the graded layer proximal to the substrate surface to a final compatible value on the side of the step-graded layer proximal to the first InP$_{1-y}$As$_y$ n-layer which is approximately equal to the lattice constant of the first InP$_{1-y}$As$_y$ n-layer.

5. The PV device of claim 4 wherein the grading in magnitude per step is 0.32 and a change in thickness per step is 0.3 μm for the step-graded InP$_{1-y}$As$_y$ n-layer.

6. The PV device of claim 4 wherein the InP n-dopant concentration is equal to or greater than $3\times10^{18}$ atoms/cm$^3$, and the InP$_{1-y}$As$_y$ n-step-graded-layer dopant concentration is equal to or greater than $1\times10^{18}$ atoms/cm$^3$.

7. A low-bandgap, monolithically interconnected module comprising in optical alignment a crystal substrate, a first InP$_{1-y}$As$_y$ layer having a p-region formed with a p-type dopant, and an n-region formed with an n-type dopant adjacent the p-region to form a single pn-junction, a Ga$_x$In$_{1-x}$As absorber layer, the absorber layer having an n-region formed with an n-type dopant and a p-region formed with a p-type dopant to form a single pn-junction, and a second InP$_{1-y}$As$_y$ p-layer formed with a p-type dopant, the values for y and x in the range of 0<y<1 and 0<x<1.

8. The monolithically interconnected module of claim 7 wherein the p-region dopant concentration of the first InP$_{1-y}$As$_y$ layer is equal to or greater than $2\times10^{17}$ atoms/cm$^3$, the dopant concentration of the first InP$_{1-y}$As$_y$ layer n-region is equal to or greater than $7\times10^{18}$ atoms/cm$^3$, the Ga$_x$In$_{1-x}$As absorber n-region dopant concentration is equal to or greater than $3\times10\times16$ atoms/cm$^3$, and the dopant concentrations of p-regions of the Ga$_x$In$_{1-x}$As absorber and second InP$_{1-y}$As$_y$ layers are equal to or greater than $5\times10^{18}$ atoms/cm$^3$.

9. The monolithically interconnected module of claim 7 further comprising in optical alignment a step-graded InP$_{1-y}$As$_y$ layer having a lattice constant which is graded in magnitude from an initial compatible value on a side of the graded layer which is proximal to a surface of the substrate to a final compatible value on the side of the graded layer which is proximal to a third InP$_{1-1}$As$_y$ layer, the step graded layer intervening the substrate and the third InP$_{1-y}$As$_y$ layer, the third InP$_{1-y}$As$_y$ layer intervening the side of the graded layer having the final compatible value and the first InP$_{1-y}$As$_y$ layer p-region wherein the y values for the step-graded InP$_{1-y}$As$_y$ and the third InP$_{1-y}$As$_y$ layers are in the range of 0<y<1 and 0<x<1.

10. The monolithically interconnected module of claim 9 wherein the grading in magnitude per step is 0.32 and a change in thickness per step is 0.3 μm for the step graded layer.

11. The monolithically interconnected module of claim 7 wherein the Ga$_x$In$_{1-x}$As absorber layer p-region has a thickness of about 0.1 μm an emitter layer sheet resistance of about 1600 ohms per square.

12. The monolithically interconnected module of claim 7 wherein the first InP$_{1-y}$As$_y$ layer n-region has a sheet resistance of about 50 ohms per square.

13. The monolithically interconnected module of claim 7 wherein the crystal substrate is double-sided-polished and semi-insulating.

14. The monolithically interconnected module of claim 13 wherein the semi-insulating substrate is InP formed with an Fe dopant.

15. The monolithically interconnected module of claim 7 wherein the bandgap (Eg) is 0.6 eV for the Ga$_x$In$_{1-x}$As absorber layer.

16. A photovoltaic power array comprising a plurality of the modules of claim 7 connected in series, wherein a vertical trench is etched through the pn-junction of the first InP$_{1-y}$As$_y$ layer providing electrical isolation of the monolithically interconnected component modules.

17. The photovoltaic power array of claim 16 wherein the n-region of the first InP$_{1-y}$As$_y$ layer provides a back-surface confinement layer for the Ga$_x$In$_{1-x}$As absorber layer and a back-contact lateral-conduction layer for the monolithically interconnected modules.

* * * * *